(12) United States Patent
Wu (10) Patent No.: US 11,966,755 B2
(45) Date of Patent: Apr. 23, 2024

(54) BOOT CONTROL CIRCUIT OF COMPUTER SYSTEM

(71) Applicant: PEGATRON CORPORATION, Taipei (TW)

(72) Inventor: Chi-Yu Wu, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 225 days.

(21) Appl. No.: 17/705,217

(22) Filed: Mar. 25, 2022

(65) Prior Publication Data

US 2022/0405105 A1 Dec. 22, 2022

(30) Foreign Application Priority Data

Jun. 17, 2021 (TW) .................................. 110122004

(51) Int. Cl.
*G06F 9/4401* (2018.01)
*H03K 17/60* (2006.01)
*H03K 17/687* (2006.01)
*H05K 1/02* (2006.01)

(52) U.S. Cl.
CPC ............. *G06F 9/442* (2013.01); *H03K 17/60* (2013.01); *H03K 17/687* (2013.01); *H05K 1/0213* (2013.01); *H05K 1/028* (2013.01); *H05K 2201/10053* (2013.01)

(58) Field of Classification Search
None
See application file for complete search history.

(56) References Cited

U.S. PATENT DOCUMENTS

| 7,679,224 | B2 | 3/2010 | Ren | |
|---|---|---|---|---|
| 7,949,886 | B2 | 5/2011 | Zou et al. | |
| 8,456,788 | B2 | 6/2013 | Wu | |
| 2011/0055601 | A1* | 3/2011 | Dang | G06F 1/26 340/657 |
| 2011/0242718 | A1* | 10/2011 | Sun | G06F 1/30 361/92 |
| 2012/0179930 | A1* | 7/2012 | Tong | G06F 1/24 713/330 |
| 2014/0078688 | A1* | 3/2014 | Liu | H01R 13/70 361/748 |
| 2016/0352095 | A1* | 12/2016 | Deng | G06F 1/26 |
| 2020/0028304 | A1* | 1/2020 | Chan | H03K 17/687 |

FOREIGN PATENT DOCUMENTS

| CN | 200990055 | Y | 12/2007 |
|---|---|---|---|
| CN | 101556496 | B | 11/2011 |
| CN | 102955718 | A | 3/2013 |
| CN | 107728700 | A | 2/2018 |
| TW | 200907657 | A | 2/2009 |
| TW | 201527955 | A | 7/2015 |
| TW | 202113546 | A | 4/2021 |

* cited by examiner

*Primary Examiner* — Fahmida Rahman
(74) *Attorney, Agent, or Firm* — Li & Cai Intellectual Property (USA) Office (57) ABSTRACT

A boot control circuit of a computer system is provided. The boot control circuit is coupled to a system power module. The boot control circuit includes a connection port module and a motherboard. The connection port module includes a detection pin. The motherboard includes a switch for controlling the system power module. The motherboard controls the system power module to provide power for booting the computer system according to a connection between the detection pin and the switch.

14 Claims, 6 Drawing Sheets

BOOT CONTROL CIRCUIT OF COMPUTER SYSTEM

CROSS-REFERENCE TO RELATED PATENT APPLICATION

This application claims the benefit of priority to Taiwan Patent Application No. 110122004, filed on Jun. 17, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a boot control circuit of a computer system, and more particularly to a boot control circuit of a computer system which provides an improved boot method.

BACKGROUND OF THE DISCLOSURE

According to standard operating procedures adopted in a factory, before a computer system is turned on for testing, operators must confirm whether each component of the computer system is disposed at a correct position during assembly of the computer system. However, for the inexperienced operator, the power of the computer system is often turned on before every component of the computer system is properly assembled to their respective positions. Since some electronic components include a large quantity of connection pins, when the connection pins are not correctly arranged, it is easy to cause a central processing unit on a motherboard to burn out.

SUMMARY OF THE DISCLOSURE

In response to the above-referenced technical inadequacies, the present disclosure provides a boot control circuit of a computer system.

In one aspect, the present disclosure provides a boot control circuit of a computer system. The boot control circuit is coupled to a system power module, and includes a connection port module and a motherboard. The connection port module includes a detection pin. The motherboard includes a switch for controlling the system power module. The motherboard controls the system power module to provide power for booting the computer system according to a connection between the detection pin and the switch.

Therefore, in the boot control circuit of the computer system provided by the present disclosure, the motherboard controls a boot status of the computer system according to a connection status of the detection pin and the switch. Even if power is turned on before an operator checks whether each electronic component is disposed at a correct position or a collision occurs to the computer system during transportation thereof, the computer system is always in a shutdown state as long as the detection pin is not connected to the switch of the motherboard. In this way, the motherboard can be prevented from being burned by abnormal currents.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 1:
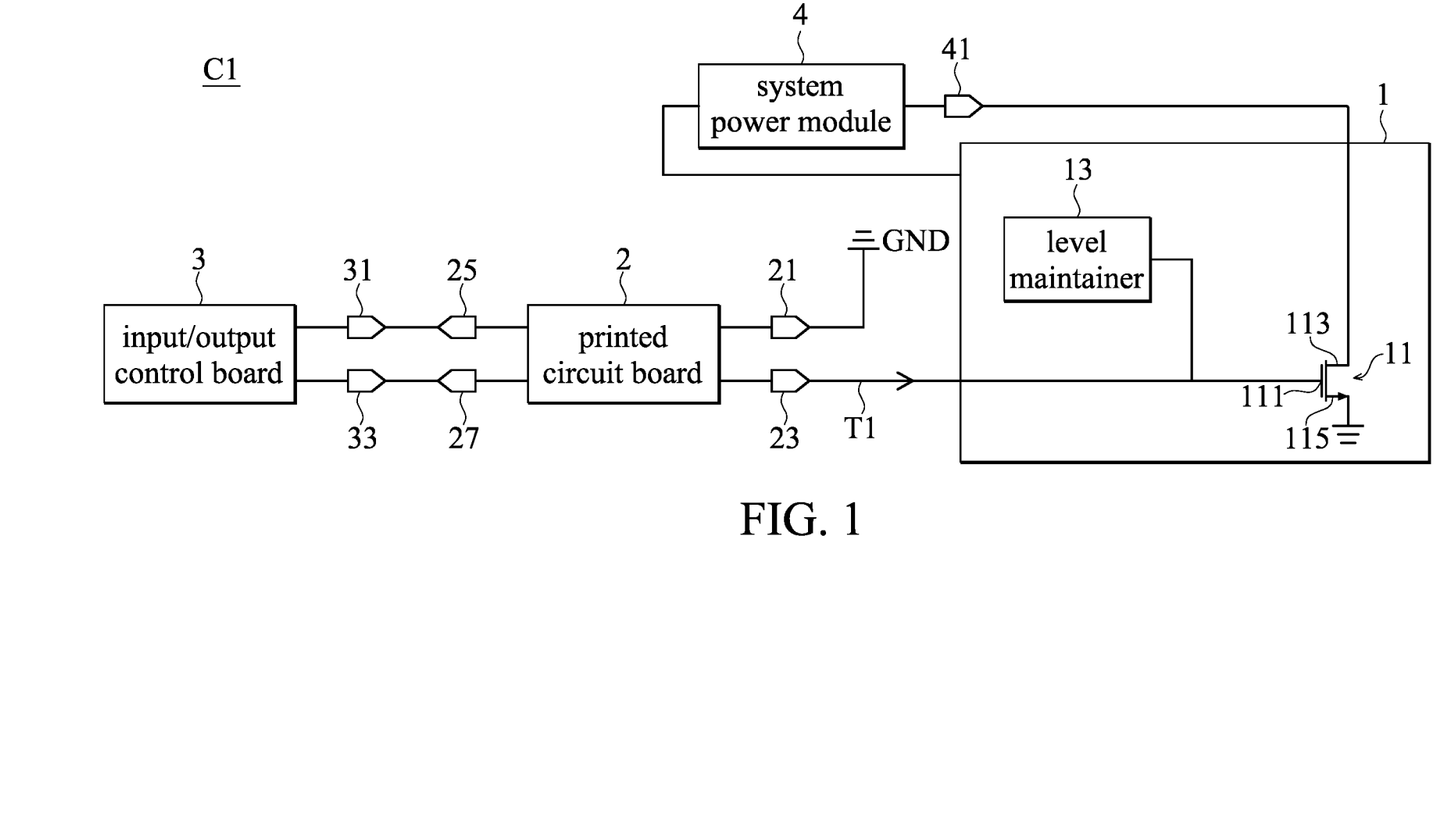
FIG. 1 is a functional block diagram of a boot control circuit of a computer system in a boot state according to a first embodiment of the present disclosure.

FIG. 1 is a functional block diagram of a boot control circuit of a computer system in a boot state according to a first embodiment of the present disclosure. Referring to FIG. 1, a boot control circuit C1 is coupled to a system power module 4 and comprises a motherboard 1 and a connection port module. In the first embodiment, the connection port module includes a printed circuit board 2 and an input/output control board 3. For example, the computer system can be a desktop computer, a laptop or a server, and the printed circuit board 2 can be a rigid printed circuit board or a flexible printed circuit board. The rigid printed circuit board can be a single-layer structure or a multi-layer structure, and the flexible printed circuit board can also be a single-layer structure or a multi-layer structure.

The input/output control board 3 includes at least one input/output interface (not shown). The input/output interface is configured for connection with an external peripheral input/output device. The input/output interface can be a USB interface, a USB-Type C interface or an IEEE 1394 interface. The system power module 4 can be, for example, an ATX power supply or a BTX power supply. However, the present disclosure is not limited to the above-mentioned examples.

As shown in FIG. 1, the motherboard 1 includes a switch 11 and a level maintainer 13. The level maintainer 13 can be a pull-high power source. The switch 11 includes a control terminal 111, an input terminal 113, and an output terminal 115. In this embodiment, the switch 11 is an N-type metal oxide semiconductor field effect transistor, and the control terminal 111, the input terminal 113 and the output terminal 115 are respectively a gate, a drain and a source. A power supply end of the system power module 4 is connected to a power receiving end of the motherboard 1, and the system power module 4 is provided with an enable pin 41. The control terminal 111 is connected to the level maintainer 13, the input terminal 113 is connected to the enable pin 41 of the system power module 4, and the output terminal 115 is grounded. For example, the level maintainer 13 includes a pull-up resistor and a voltage power supply.

In the first embodiment, the printed circuit board 2 is a flexible printed circuit board with multiple layers, and the printed circuit board 2 includes an input pin 21, a detection pin 23, a first pin 25, and a second pin 27. The input pin 21 and the first pin 25 are respectively disposed at opposite ends of a first layer of the printed circuit board 2, the input pin 21 is grounded, and the first pin 25 is connected to the input pin 21. The detection pin 23 and the second pin 27 are respectively disposed at opposite ends of a second layer of the printed circuit board 2, and the second pin 27 is connected to the detection pin 23. In other embodiments of the printed circuit board 2, the position of each of the input pin 21, the detection pin 23, the first pin 25, and the second pin 27 on the printed circuit board 2 can be changed. For example, the input pin 21 is located at the first layer of the printed circuit board 2, the first pin 25 is located at the second layer of the printed circuit board 2, the second pin 27 is located at the third layer of the printed circuit board 2, and the detection pin 23 is located at the second layer of the printed circuit board 2.

The input/output control board 3 includes a third pin 31 and a fourth pin 33. The third pin 31 is connected to the first pin 25 of the printed circuit board 2, and the fourth pin 33 is connected to the third pin 31 and the second pin 27 of the printed circuit board 2.

The input pin 21 of the printed circuit board 2, the first pin 25 of the printed circuit board 2, the third pin 31 of the input/output control board 3, the fourth pin 33 of the input/output control board 3, the second pin 27 of the printed circuit board 2 and the detection pin 23 of the printed circuit board 2 form a loop circuit. When the detection pin 23 of the printed circuit board 2 is connected to the control terminal 111 of the switch 11, through the loop circuit, the detection pin 23 outputs a first trigger signal T1 to the control terminal 111. The first trigger signal T1 has a ground potential, and the ground potential is 0 volt. In detail, when the switch 11 of the motherboard 1 is connected to the detection pin 23 of the loop circuit, the ground potential of the first trigger signal T1 pulls down a voltage provided by the level maintainer 13, thereby causing a voltage level of a signal received by the switch 11 to be lower than a threshold voltage of the switch 11. As a result, the switch 11 is in an off state. When the switch 11 is in the off state, a voltage level of the enable pin 41 is greater than or equal to a startup level of the system power module 4, and the system power module 4 outputs power to the motherboard 1 for booting the computer system.

Figure 2:
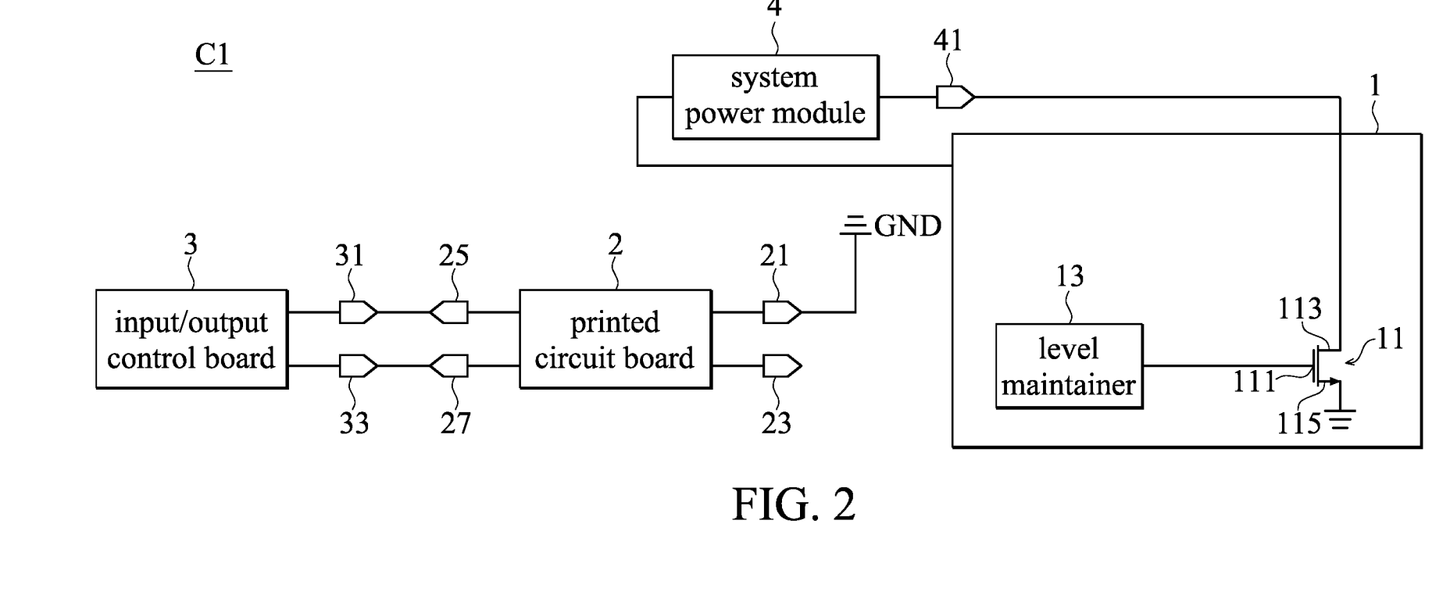
FIG. 2 is a functional block diagram of the boot control circuit of the computer system in a shutdown state according to the first embodiment of the present disclosure.

FIG. 2 is a functional block diagram of the boot control circuit of the computer system in a shutdown state according to the first embodiment of the present disclosure. Referring to FIG. 2, when the detection pin 23 of the printed circuit board 2 is disconnected from the control terminal 111 of the switch 11, a voltage level (e.g., 3 volts) of a signal provided by the level maintainer 13 is greater than the threshold voltage of the switch 11 to cause the switch 11 to be in an on state. When the switch 11 is in the on state, the voltage level of the enable pin 41 is lower than the startup level of the system power module 4, and the system power module 4 does not output the power to the motherboard 1. As a result, the computer system is in the shutdown state.

Figure 3:
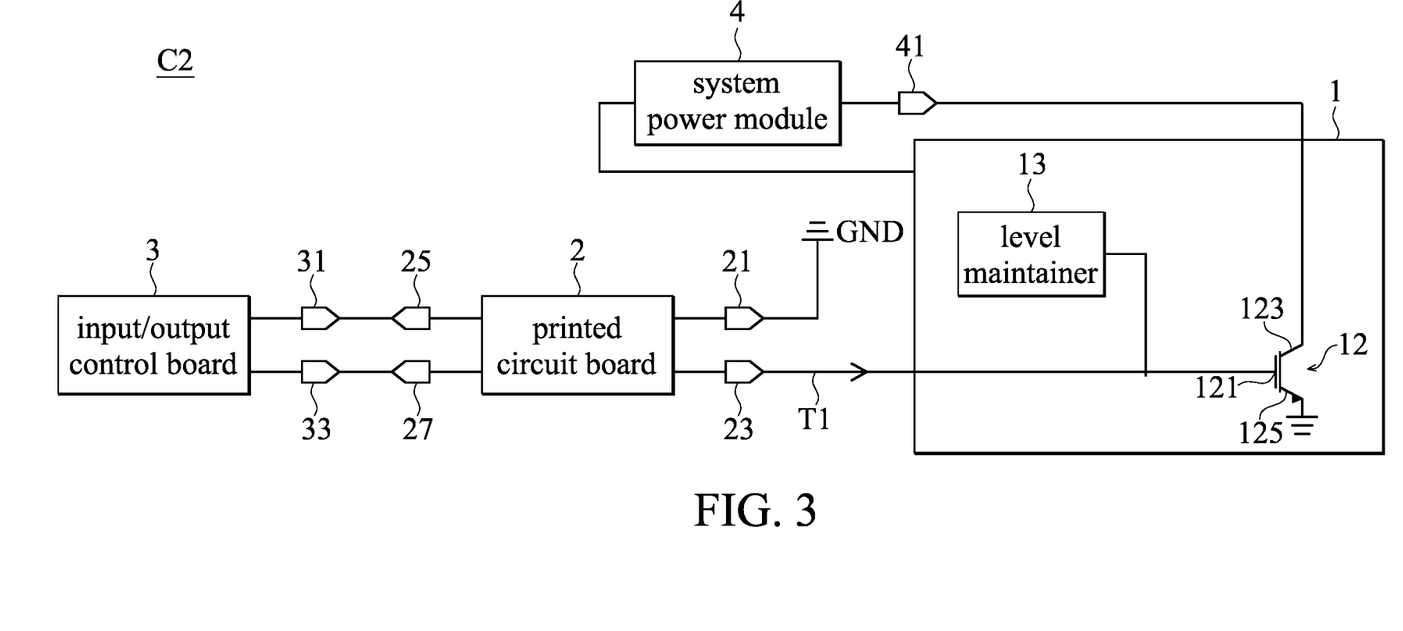
FIG. 3 is a functional block diagram of the boot control circuit of the computer system in the boot state according to a second embodiment of the present disclosure.

FIG. 3 is a functional block diagram of the boot control circuit of the computer system in the boot state according to a second embodiment of the present disclosure. Referring to FIG. 3, the differences between the boot control circuit of the second embodiment and that of the first embodiment are described below. In the second embodiment, a switch 12 of a boot control circuit C2 is an NPN type bipolar junction transistor, and a control terminal 121, an input terminal 123, and an output terminal 125 are respectively a base and a collector and an emitter. The control terminal 121 is connected to the level maintainer 13, the input terminal 123 is connected to the enable pin 41 of the system power module 4, and the output terminal 125 is grounded.

The detection pin 23 of the printed circuit board 2 is connected to the control terminal 121 of the switch 12. Through the loop circuit formed by the input pin 21 of the printed circuit board 2, the first pin 25 of the printed circuit board 2, the third pin 31 of the input/output control board 3, the fourth pin 33 of the input/output control board 3, the second pin 27 of the printed circuit board 2 and the detection pin 23 of the printed circuit board 2, the detection pin 23 outputs the first trigger signal T1 to the control terminal 121. The ground potential of the first trigger signal T1 pulls down the voltage provided by the level maintainer 13, so that a voltage level of a signal received by the switch 12 is lower than a threshold voltage of the switch 12. As a result, the switch 12 is in an off state. When the switch 12 is in the off state, the voltage level of the enable pin 41 is greater than or equal to the startup level of the system power module 4, and the system power module 4 outputs the power to the motherboard 1 for booting the computer system.

Similarly, when the detection pin 23 of the printed circuit board 2 of the boot control circuit C2 is disconnected from the control terminal 121 of the switch 12 (not shown), the voltage level of the signal provided by the level maintainer 13 is greater than the threshold voltage of the switch 12 to cause the switch 12 to be in an on state. When the switch 12 is in the on state, the voltage level of the enable pin 41 is lower than the startup level of the system power module 4, and the system power module 4 does not output the power to the motherboard 1. As a result, the computer system is in the shutdown state.

Figure 4:
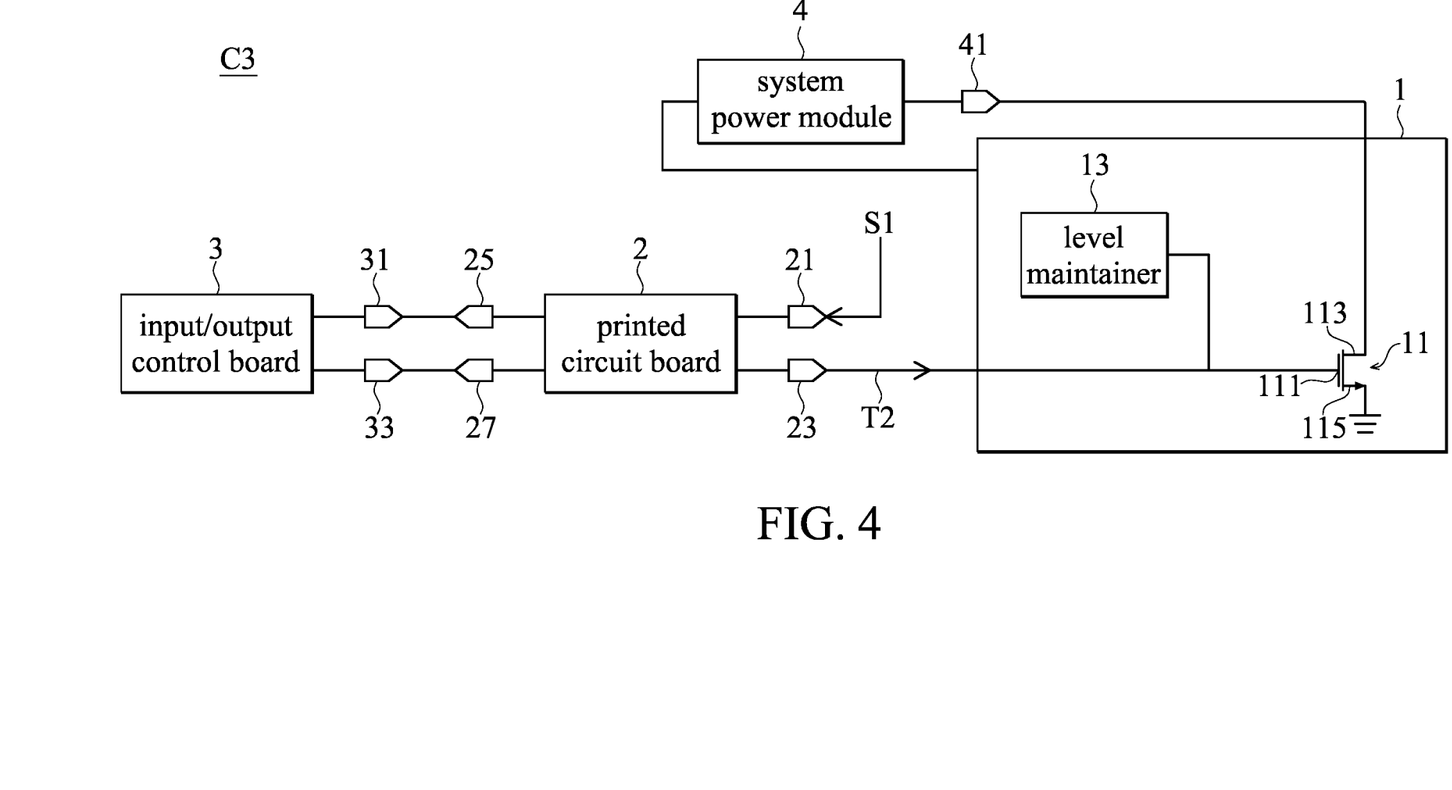
FIG. 4 is a functional block diagram of the boot control circuit of the computer system in the boot state according to a third embodiment of the present disclosure.

FIG. 4 is a functional block diagram of the boot control circuit of the computer system in the boot state according to a third embodiment of the present disclosure. Referring to FIG. 4, the differences between the boot control circuit of the third embodiment and that of the first embodiment are described below. In the third embodiment, the input pin 21 of the printed circuit board 2 of a boot control circuit C3 is configured to receive a first input signal 51, the first input signal 51 has a first voltage level, and the first voltage level is lower than the threshold voltage of the switch 11 and higher than the ground potential. For example, the first input signal 51 comes from a battery of the computer system that is different from the system power module 4 or comes from an external signal generator. The first voltage level can be 0.2 volts, and the threshold voltage of the switch 11 can be 0.7 volts. However, the present disclosure is not limited to the above-mentioned examples.

Through the loop circuit formed by the input pin 21, the first pin 25, the third pin 31, the fourth pin 33, the second pin 27 and the detection pin 23, the detection pin 23 of the printed circuit board 2 outputs a second trigger signal T2 (which has the first voltage level) to the control terminal 111. The first voltage level of the second trigger signal T2 pulls down the voltage provided by the level maintainer 13, so that the voltage level of the signal received by the switch 11 is lower than the threshold voltage of the switch 11. As a result, the switch 11 is in the off state. When the switch 11 is in the off state, the voltage level of the enable pin 41 is greater than or equal to the startup level of the system power module 4, and the system power module 4 outputs the power to the motherboard 1 for booting the computer system.

Similarly, when the detection pin 23 of the printed circuit board 2 of the boot control circuit C3 is disconnected from the control terminal 111 of the switch 11 (not shown), the voltage level of the signal provided by the level maintainer 13 is greater than the threshold voltage of the switch 11 to cause the switch 11 to be in the on state. When the switch 11 is in the on state, the voltage level of the enable pin 41 is lower than the startup level of the system power module 4, and the system power module 4 does not output the power to the motherboard 1. As a result, the computer system is in the shutdown state.

Figure 5:
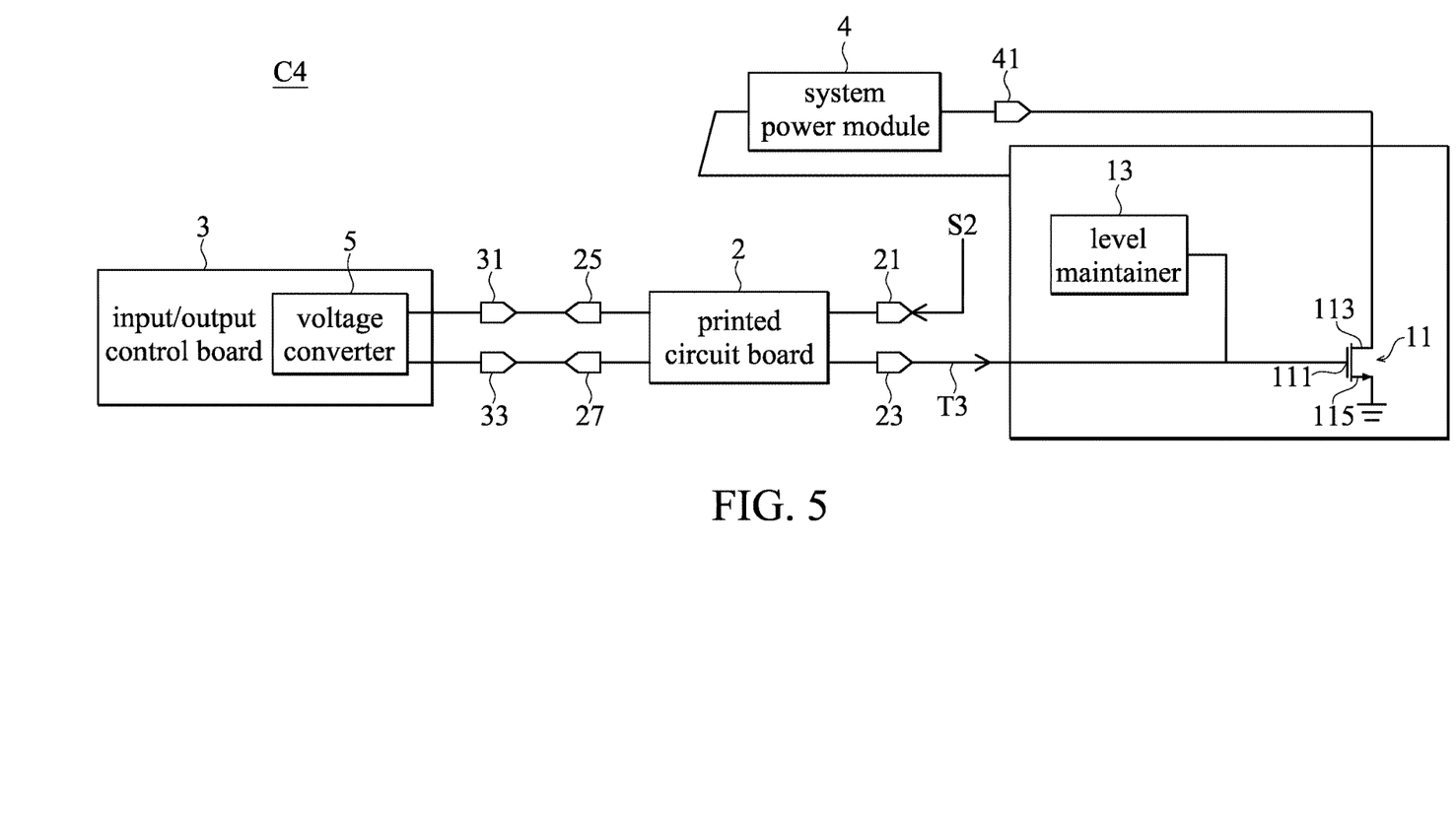
FIG. 5 is a functional block diagram of the boot control circuit of the computer system in the boot state according to a fourth embodiment of the present disclosure.

FIG. 5 is a functional block diagram of the boot control circuit of the computer system in the boot state according to a fourth embodiment of the present disclosure. Referring to FIG. 5, the differences between the boot control circuit of the fourth embodiment and that of the first embodiment are described below. In the fourth embodiment, a boot control circuit C4 further comprises a voltage converter 5, the voltage converter 5 is provided on the input/output control board 3, and input and output ends of the voltage converter 5 are respectively connected to the third pin 31 and the fourth pin 33 of the input/output control board 3.

The input pin 21 of the printed circuit board 2 is configured to receive a second input signal S2, the second input signal S2 has a second voltage level, and the second voltage level is higher than the threshold voltage of the switch 11. For example, the second input signal S2 comes from a battery of the computer system that is different from the system power module 4 or comes from an external signal generator. The second voltage level can be 1 volt, and the threshold voltage of the switch 11 can be 0.7 volts. However, the present disclosure is not limited to the above-mentioned examples.

The second input signal S2 is transmitted to the voltage converter 5 through the first pin 25 of the printed circuit board 2 and the third pin 31 of the input/output control board 3. The voltage converter 5 receives the second input signal S2 and reduces the voltage level of the second input signal S2, such that the output end of the voltage converter 5 outputs a third trigger signal T3 having a third voltage level. The third voltage level is lower than the second voltage level and the threshold voltage of the switch 11. For example, the third voltage level may be 0.2 volts, and the threshold voltage of the switch 11 may be 0.7 volts. However, the present disclosure is not limited to the above-mentioned examples. The third trigger signal T3 passes through the fourth pin 33, the second pin 27, and the detection pin 23 in sequence. Finally, the third trigger signal T3 is outputted by the detection pin 23 and transmitted to the control terminal 111.

The third voltage level of the third trigger signal T3 pulls down the voltage provided by the level maintainer 13, so that the voltage level of the signal received by the switch 11 is lower than the threshold voltage of the switch 11. As a result, the switch 11 is in the off state. When the switch 11 is in the off state, the voltage level of the enable pin 41 is greater than or equal to the startup level of the system power module 4, and the system power module 4 outputs the power to the motherboard 1 for booting the computer system.

Similarly, when the detection pin 23 of the printed circuit board 2 of the boot control circuit C4 is disconnected from the control terminal 111 of the switch 11 (not shown), the voltage level of the signal provided by the level maintainer 13 is greater than the threshold voltage of the switch 11 to cause the switch 11 to be in the on state. When the switch 11 is in the on state, the voltage level of the enable pin 41 is lower than the startup level of the system power module 4, and the system power module 4 does not output the power to the motherboard 1. As a result, the computer system is in the shutdown state.

Figure 6:
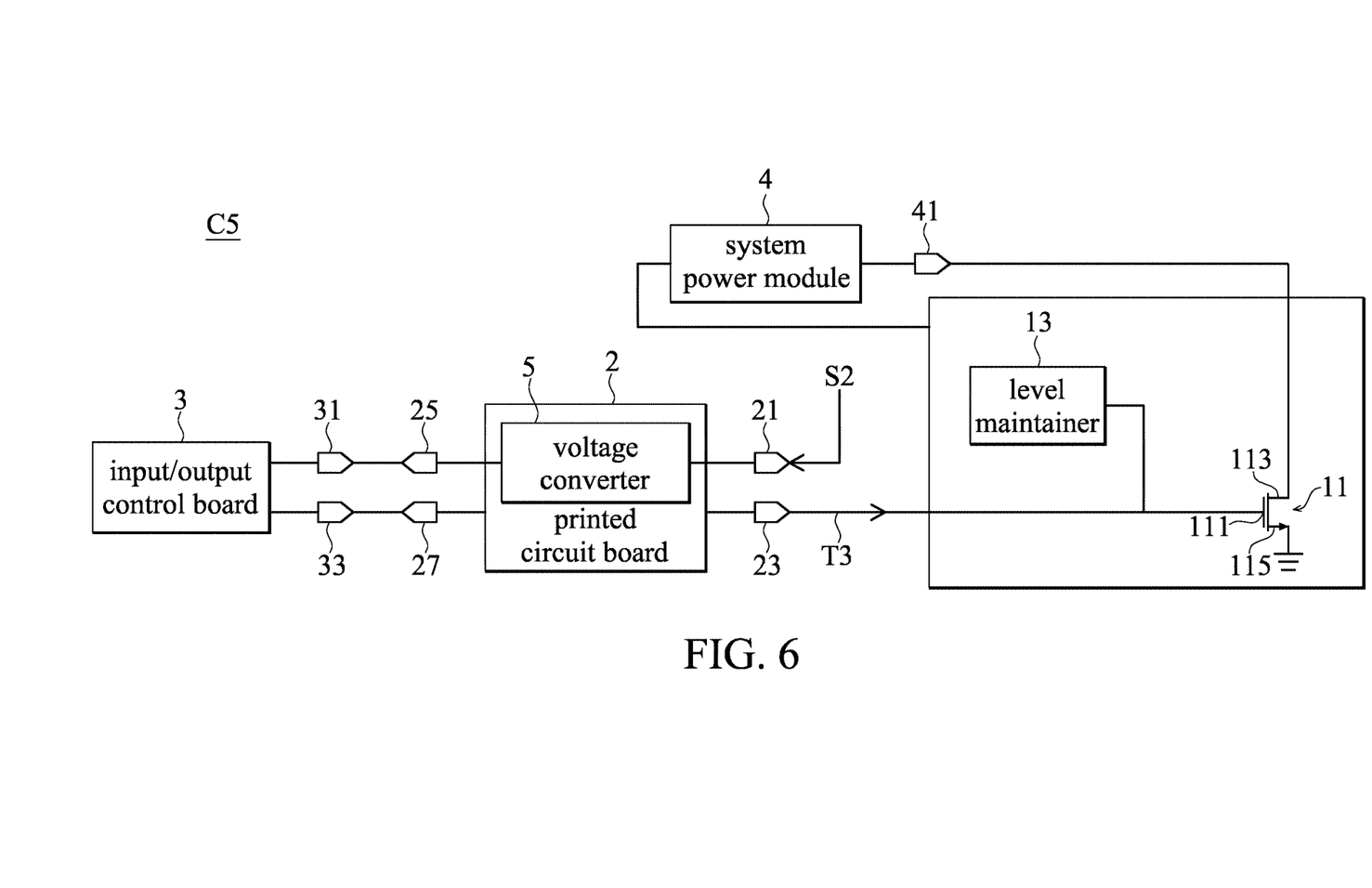
FIG. 6 is a functional block diagram of the boot control circuit of the computer system in the boot state according to a fifth embodiment of the present disclosure.

FIG. 6 is a functional block diagram of the boot control circuit of the computer system in the boot state according to a fifth embodiment of the present disclosure. Referring to FIG. 6, the differences between the boot control circuit of the fifth embodiment and that of the first embodiment are described below. In the fifth embodiment, a boot control circuit C5 further comprises the voltage converter 5, the voltage converter 5 is provided on the printed circuit board 2, and the input and output ends of the voltage converter 5 are respectively connected to the input pin 21 and the first pin 25 of the printed circuit board 2.

The input pin 21 of the printed circuit board 2 is configured to receive the second input signal S2, the second input signal S2 has the second voltage level, and the second voltage level is higher than the threshold voltage of the switch 11. For example, the second voltage level can be 1 volt, and the threshold voltage of the switch 11 can be 0.7 volts. However, the present disclosure is not limited to the above-mentioned examples.

Through the input pin 21, the voltage converter 5 receives the second input signal S2 and reduces the voltage level of the second input signal S2, such that the output end of the voltage converter 5 outputs the third trigger signal T3 having the third voltage level. The third voltage level is lower than the second voltage level and the threshold voltage of the switch 11. For example, the third voltage level may be 0.2 volts, and the threshold voltage of the switch 11 may be 0.7 volts. However, the present disclosure is not limited to the above-mentioned examples.

The third trigger signal T3 passes through the first pin 25, the third pin 31, the fourth pin 33, the second pin 27 and the detection pin 23 in sequence. Finally, the third trigger signal T3 is outputted by the detection pin 23 and transmitted to the control terminal 111. The third voltage level of the third trigger signal T3 pulls down the voltage provided by the level maintainer 13, so that the voltage level of the signal received by the switch 11 is lower than the threshold voltage of the switch 11. As a result, the switch 11 is in the off state. When the switch 11 is in the off state, the voltage level of the enable pin 41 is greater than or equal to the startup level of the system power module 4, and the system power module 4 outputs the power to the motherboard 1 for booting the computer system.

Similarly, when the detection pin 23 of the printed circuit board 2 of the boot control circuit C5 is disconnected from the control terminal 111 of the switch 11 (not shown), the voltage level of the signal provided by the level maintainer 13 is greater than the threshold voltage of the switch 11 to cause the switch 11 to be in the on state. When the switch 11 is in the on state, the voltage level of the enable pin 41 is lower than the startup level of the system power module 4, and the system power module 4 does not output the power to the motherboard 1. As a result, the computer system is in the shutdown state.

In conclusion, in the boot control circuit of the computer system provided by the present disclosure, the motherboard controls a boot status of the computer system according to a connection status of the detection pin and the switch. Even if power is turned on before an operator checks whether each electronic component is disposed at a correct position or a collision occurs to the computer system during transportation thereof, the computer system is always in a shutdown state as long as the detection pin is not connected to the switch of the motherboard. In this way, the motherboard can be prevented from being burned by abnormal currents.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A boot control circuit of a computer system, wherein the boot control circuit is coupled to a system power module and comprises:
   a connection port module comprising a detection pin; and
   a motherboard comprising a switch for controlling the system power module;
   wherein the motherboard controls the system power module to provide power for booting the computer system according to a connection between the detection pin and the switch;
   wherein the system power module includes an enable pin, the motherboard includes a level maintainer, the switch includes a control terminal, an input terminal and an output terminal, the control terminal is connected to the level maintainer, the input terminal is connected to the enable pin, the output terminal is grounded, when the detection pin is connected to the control terminal, the system power module outputs the power to boot the computer system.

2. The boot control circuit according to claim 1, wherein, when the detection pin is disconnected from the switch, the system power module does not provide the power such that the computer system is in a shutdown state.

3. The boot control circuit according to claim 1, wherein the connection port module includes a printed circuit board and an input/output control board, the detection pin is disposed at the printed circuit board, and the input/output control board is connected to the printed circuit board.

4. The boot control circuit according to claim 3, wherein the printed circuit board further includes an input pin, and the input pin is grounded, when the detection pin is connected to the switch, the detection pin transmits a trigger signal to the switch, and the trigger signal has a ground potential to cause the switch to be in an off state.

5. The boot control circuit according to claim 3, wherein the printed circuit board further includes an input pin for receiving an input signal, when the detection pin is connected to the switch, the detection pin transmits a trigger signal to the control terminal, and the trigger signal causes the switch to be in an off state.

6. The boot control circuit according to claim 5, wherein the input signal has a first voltage level, the trigger signal has the first voltage level, and the first voltage level is lower than a threshold voltage of the switch.

7. The boot control circuit according to claim 5, wherein the input signal has a first voltage level, the trigger signal has a second voltage level, the first voltage level is higher than the second voltage level, and the second voltage level is lower than a threshold voltage of the switch.

8. The boot control circuit according to claim 7, further comprising a voltage converter, wherein the voltage converter is provided on the printed circuit board or the input/output control board, the voltage converter is electrically connected to the input pin and the detection pin, and the voltage converter is configured to decrease the first voltage level of the input signal.

9. The boot control circuit according to claim 4, wherein the printed circuit board is a flexible printed circuit board, and the input pin and the detection pin are respectively located at two different layers of the flexible printed circuit board.

10. The boot control circuit according to claim 5, wherein the printed circuit board is a flexible printed circuit board, and the input pin and the detection pin are respectively located at two different layers of the flexible printed circuit board.

11. The boot control circuit according to claim 4, wherein the printed circuit board includes a first pin and a second pin, the input/output control board includes a third pin and a fourth pin, the first pin is coupled to the input pin and the third pin, the fourth pin is coupled to the third pin and the second pin, the second pin is coupled to the detection pin, and the input pin, the first pin, the second pin, the third pin, the fourth pin and the detection pin form a loop circuit.

12. The boot control circuit according to claim 5, wherein the printed circuit board includes a first pin and a second pin, the input/output control board includes a third pin and a fourth pin, the first pin is coupled to the input pin and the third pin, the fourth pin is coupled to the third pin and the second pin, the second pin is coupled to the detection pin, and the input pin, the first pin, the second pin, the third pin, the fourth pin and the detection pin form a loop circuit.

13. The boot control circuit according to claim 1, wherein the switch is a metal oxide semiconductor field effect transistor, and the control terminal, the input terminal and the output terminal are respectively a gate, a drain and a source.

14. The boot control circuit according to claim 1, wherein the switch is an NPN type bipolar junction transistor, and the control terminal, the input terminal and the output terminal are respectively a base, a collector and an emitter.

* * * * *